US006875971B2

(12) United States Patent
Kim

(10) Patent No.: US 6,875,971 B2
(45) Date of Patent: Apr. 5, 2005

(54) WAFER EDGE EXPOSURE APPARATUS, AND WAFER EDGE EXPOSURE METHOD

(75) Inventor: Jeong Yeal Kim, Yokohama (JP)

(73) Assignee: Semiconductor Leading Edge Technologies, Inc., Kanagawa (JP)

( * ) Notice: Subject to any disclaimer, the term of this patent is extended or adjusted under 35 U.S.C. 154(b) by 88 days.

(21) Appl. No.: 10/036,505

(22) Filed: Jan. 7, 2002

(65) Prior Publication Data

US 2002/0092964 A1 Jul. 18, 2002

(30) Foreign Application Priority Data

Jan. 15, 2001 (JP) ........................................ 2001-006107

(51) Int. Cl.[7] .............................................. G03B 27/54
(52) U.S. Cl. ..................... 250/201.2; 250/204; 355/55; 355/68
(58) Field of Search ............................. 250/201.2, 204, 250/548, 559.45, 559.22, 559.27, 210.4; 355/53, 55, 68

(56) References Cited

U.S. PATENT DOCUMENTS

| 4,383,757 A | * | 5/1983 | Phillips | 355/53 |
| 4,910,549 A | * | 3/1990 | Sugita | 355/53 |
| 5,168,304 A | * | 12/1992 | Hattori | 355/50 |
| 5,361,121 A | * | 11/1994 | Hattori et al. | 355/50 |
| 5,489,966 A | | 2/1996 | Kawashima et al. | |
| 5,546,179 A | * | 8/1996 | Cheng | 356/73 |
| 5,654,553 A | * | 8/1997 | Kawakubo et al. | 250/548 |
| 5,880,816 A | * | 3/1999 | Mimura et al. | 355/53 |
| 6,256,087 B1 | * | 7/2001 | Bader | 355/67 |
| 6,515,733 B1 | * | 2/2003 | Udo | 355/53 |
| 6,611,345 B1 | * | 8/2003 | Luxem | 356/614 |
| 2002/0018192 A1 | * | 2/2002 | Nishi | 355/53 |
| 2003/0128348 A1 | * | 7/2003 | Nishi | 355/53 |

FOREIGN PATENT DOCUMENTS

| JP | 05-267160 A | 10/1993 |
| JP | 08-321463 A | 12/1996 |
| JP | 09-232231 A | 9/1997 |
| JP | Hei 9-260263 | 10/1997 |

* cited by examiner

*Primary Examiner*—Diego Gutierrez
*Assistant Examiner*—Tania Courson
(74) *Attorney, Agent, or Firm*—Foley & Lardner LLP

(57) ABSTRACT

A wafer edge exposure apparatus is provided with an optical section for radiating exposure light onto the edge of a semiconductor wafer. The optical section is provided with a focus sensor for sensing a distance from the lower end of the optical section to the edge of the semiconductor wafer. There is provided a position control mechanism for moving the optical section vertically on the basis of a value detected by the focus sensor such that the distance matches a focal distance of the optical section.

12 Claims, 6 Drawing Sheets

WAFER EDGE EXPOSURE APPARATUS, AND WAFER EDGE EXPOSURE METHOD

BACKGROUND OF THE INVENTION

1. Field of the Invention

The present invention relates to a wafer edge exposure apparatus and a water edge exposure method. More particularly, the present invention relates to a wafer edge exposure apparatus and wafer edge optical exposing method for accurately exposing the edge of resist coated over a semiconductor wafer.

2. Description of the Background Art

FIG. 3 shows a flowchart representing a popular processing flow to be effected for a certain layer (called here an "$i^{th}$layer") in connection with a related-art semiconductor device manufacturing method. During the processing shown in FIG. 3, resist is applied over a semiconductor wafer by means of a spin coater (step 100).

The resist applied to the edge of the semiconductor water produces foreign substances when interfering with a mechanism of retaining a semiconductor wafer in subsequent processes. In order to prevent production of such foreign substances, the resist applied to the edge of the wafer is removed as much as 1 mm width in the spin coater by means of a thinner (step 102).

Next, the semiconductor wafer is subjected to pattern exposure performed by a stepper (step 104). Through exposure processing, a desired pattern is transferred onto the resist on the semiconductor wafer upon exposed to radiation.

The semiconductor wafer is further subjected to edge exposure processing performed by an edge exposure apparatus (step 106). The edge exposure apparatus is for exposing the edge of a wafer over a desired width (e.g., 2 mm or 3 mm).

When having finished undergoing the pattern exposure processing and edge exposure processing, the semiconductor wafer is subjected to process of developing a resist (step 108). As a result of the processing being performed, the resist located along the edge of the wafer is removed over a desired width (2 mm or 3 mm), and the resist on the semiconductor wafer is patterned into a desired pattern.

There is then performed processing for etching the semiconductor wafer while the thus-patterned resist is taken as a mask or implanting impurities into the semiconductor wafer (step 110).

FIG. 4A is a plan view showing a semiconductor wafer to be processed through a round of processing operations set forth. FIG. 4B is a cross-sectional view of the semiconductor wafer. More specifically, FIG. 4A is a plan view showing a semiconductor wafer 10 having finished undergoing processing pertaining to step 102; that is, when resist 12 has been removed from the edge of the wafer by means of a thinner. FIG. 4B is a cross-sectional view of the semiconductor wafer 10 taken along line A—A shown in FIG. 4A. As shown in FIG. 4B, when the resist 12 is removed from the edge of the wafer by means of the thinner, the end surface of the resist 12 is tapered. Here, the following description is based on the assumption that the resist 12 is applied over a first layer film 14, as shown in FIG. 4I.

FIG. 5 shows the first layer film 14 when the film has been etched while the resist 12 shown in FIG. 4B is taken as a mask. When the end face of the resist 12 is tapered as shown in FIG. 4B, the outer most edge of the resist 12 does not sufficiently act as a mask during the course of etching operation. Hence, when such a resist 12 is used as a mask, the vicinity of the end face of the first layer film 14 is etched insufficiently, as shown in FIG. 5. As a result, foreign obstacles become apt to arise.

FIG. 6A is a plan view of the semiconductor wafer 10 after having finished undergoing processing pertaining to step 108; that is, after the resist 12 has been removed from the edge of the wafer through edge exposure processing and development processing. FIG. 6B is a cross-sectional view of the semiconductor wafer 10 when taken along line A—A shown in FIG. 6A.

As shown in FIG. 6B, the edge of the resist 12 can be removed such that the end face of the resist 12 becomes substantially perpendicular, through edge exposure processing and development processing. When such a resist 12 is used as a mask, the first layer film 14 can be etched to an appropriate state; namely, a state in which foreign substances are less likely to be generated. Hence, the related-art manufacturing method enables appropriate processing of the ith layer of a semiconductor device.

However, during the course of manufacture of a semiconductor device, a plurality of layers must be formed on the semiconductor wafer 10. For example, FIG. 8 shows a state in which a first layer film 16, a second layer film 18, a third layer film 20, a fourth layer film 22, and a fifth layer film 24 are formed on the semiconductor wafer 10 and the resist 12 is coated on the first through fifth layer films. In this case, there arises a necessity for exposing the edge of the resist 12 at a position situated above the fifth layer film 24, thereby removing the edge.

The related-art edge exposure apparatus to be used for exposing the edge of the resist 12 is configured such that a focal point of the exposure apparatus is substantially accords with the surface position of the semiconductor wafer 10. Therefore, when the resist 12 is formed on the fifth layer film 24, the focal point of exposure light originating from the edge exposure apparatus comes out of accordance with the location of the resist 12.

FIG. 9 shows a state of the semiconductor wafer when the wafer has finished undergoing development processing while the focal point of the exposure light remains out of accordance with the surface position of the resist 12. In this case, the edge of the resist 12 is not activated properly, and hence the end face of the resist 12 is slightly tapered. If the end face of the resist 12 is tapered, the fifth layer 24 becomes apt to generate foreign substance after etching processing, as in the case shown in FIG. 5. In this respect, the related art manufacturing method has failed to completely solve a problem of foreign substances arising from an edge of a film to be etched.

SUMMARY OF THE INVENTION

The present invention has been conceived to solve the problem and is primarily aimed at providing a wafer edge exposure apparatus capable of appropriately causing an edge of a resist film to become exposed appropriately at all times even when the resist film is formed on any layer.

The present invention is also aimed at providing a wafer edge exposure method for causing an edge of a resist film to become exposed appropriately at all times even when the resist film is formed on any layer.

The above objects of the present invention are achieved by a wafer edge exposure apparatus for exposing an edge of a semiconductor wafer. The apparatus includes an optical section for radiating exposure light toward an edge of a semiconductor wafer. The apparatus also includes a sensor for detecting the height of the edge. The apparatus further includes a focus position control mechanism for controlling the focal position of exposure light originating from the optical section, on the basis of a value detected by the sensor.

The above objects of the present invention are also achieved by a wafer edge exposure method for exposing an edge of a semiconductor wafer. The method includes a detection step for detecting the height of an edge of a semiconductor wafer. The method also includes a control step for controlling the focusing position of exposure light radiated toward the edge, on the basis of a height of the edge. The method further includes an exposure step of radiating exposure light towards the edge after the control step.

Other objects and further features of the present invention will be apparent from the following detailed description when read in conjunction with the accompanying drawings.

DESCRIPTION OF THE PREFERRED EMBODIMENTS

Figure 1:
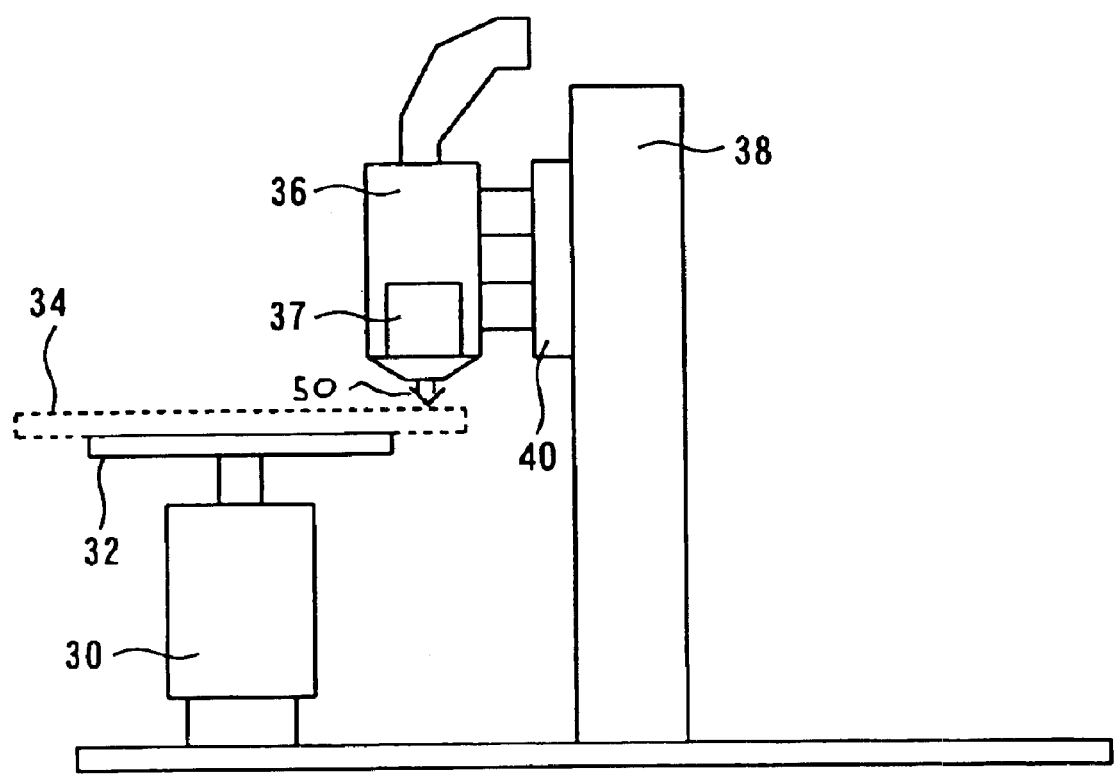
FIG. 1 is an illustration showing the principal section a of a wafer edge exposure apparatus according to a first embodiment of the present invention.

Embodiments of the present invention will be described hereinbelow by reference to the accompanying drawings. Throughout the drawings, like elements are assigned like reference numerals, and repeated explanations thereof are omitted.

First Embodiment

FIG. 1 is an illustration showing the principal section of a wafer edge exposure apparatus according to a first embodiment of the present invention. As shown in FIG. 1, the wafer edge exposure apparatus according to the embodiment has a chuck drive motor 30. A chuck 32 is provided on top of the chuck drive motor 30. The chuck 32 is an element for retaining a semiconductor wafer 34 to be placed thereon. The chuck drive motor 30 can rotate the semiconductor wafer 34 held on the chuck 32 within a plane perpendicular to the plane of the paper of the drawing.

An optical section 36 is provided in an elevated position relative to the chuck 32. An exposure light radiation section (not shown) for radiating exposure light of predetermined width to the edge of the semiconductor wafer 34 is provided at a lower end of the optical section 36. In the wafer edge exposure apparatus according to the present embodiment, exposure light 50 can be radiated onto the edge of the semiconductor wafer 34; more specifically, an annular portion of predetermined width located at the outermost edge of the semiconductor wafer 34, by means of rotating the chuck drive motor 30 under circumstances where the optical section 36 produces exposure light 50.

A focus sensor 37 is provided at the lower end of the optical section 36. The focus sensor 37 can detect a distance from the lower end of the optical section 36 to the surface of the semiconductor wafer 34; namely, a surface to be exposed. For instance, in a case where resist is applied over the surface of the semiconductor water 34, the focus sensor 37 can detect a distance from the lower end of the optical section 36 to the surface of the resist. The distance detected by the focus sensor 37 is supplied to an unillustrated control unit.

The optical section 36 is retained by a position control mechanism 38. The position control mechanism 38 is provided with a position control motor 40 for changing the vertical position of the optical section 36. The position control motor 40 is controlled by the control unit (not shown).

Figure 3:
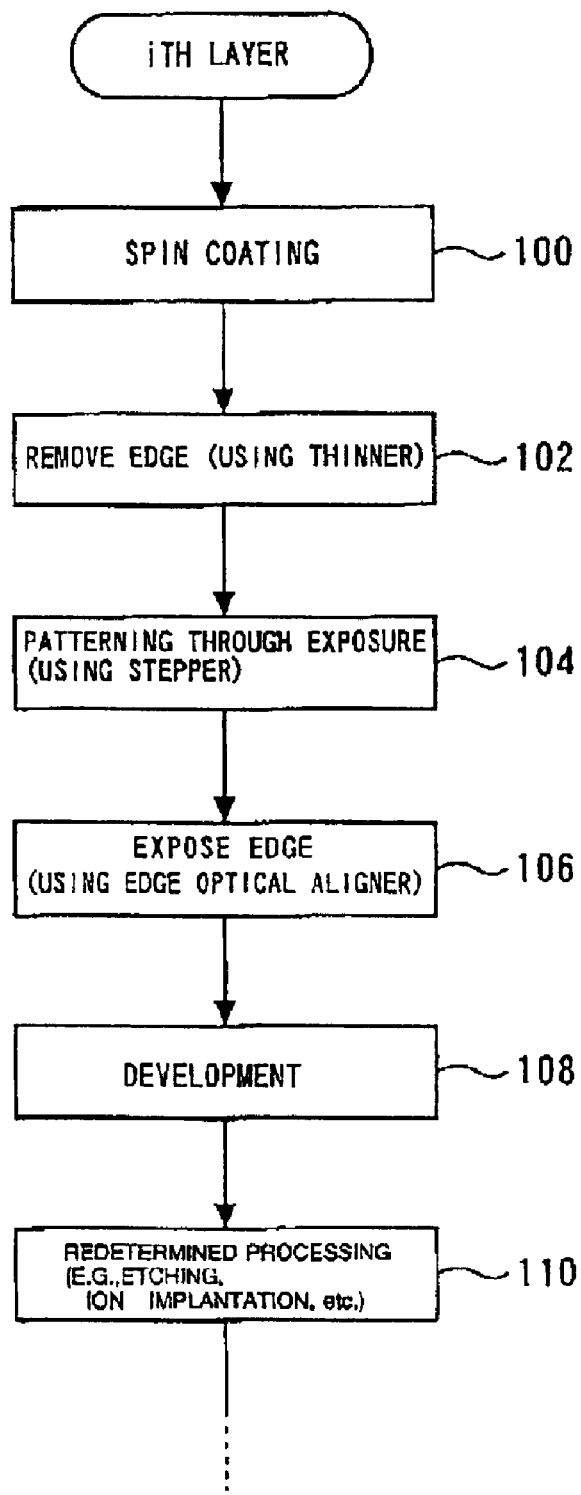
FIG. 3 is a flowchart representing a popular processing flow to be effected for a certain layer in connection with a related-art semiconductor device manufacturing method.

The wafer edge exposure apparatus according to the present embodiment is for performing processing pertaining to step 106 shown in FIG. 3 (i.e., edge exposure processing). More specifically, the wafer edge exposure apparatus according to the present embodiment is used for exposing the edge of the semiconductor wafer that has undergone processing pertaining to steps 100 to 104 shown in FIG. 3. The semiconductor wafer that has been processed by the wafer edge exposure apparatus according to the present embodiment is subjected to processing pertaining to steps 108 and 110 shown in FIG. 3. Processing pertaining to steps 100 through 104 and processing pertaining to steps 108 and 110 are identical with processing performed in the related art, and hence repeated explanations thereof are omitted.

Figure 2:
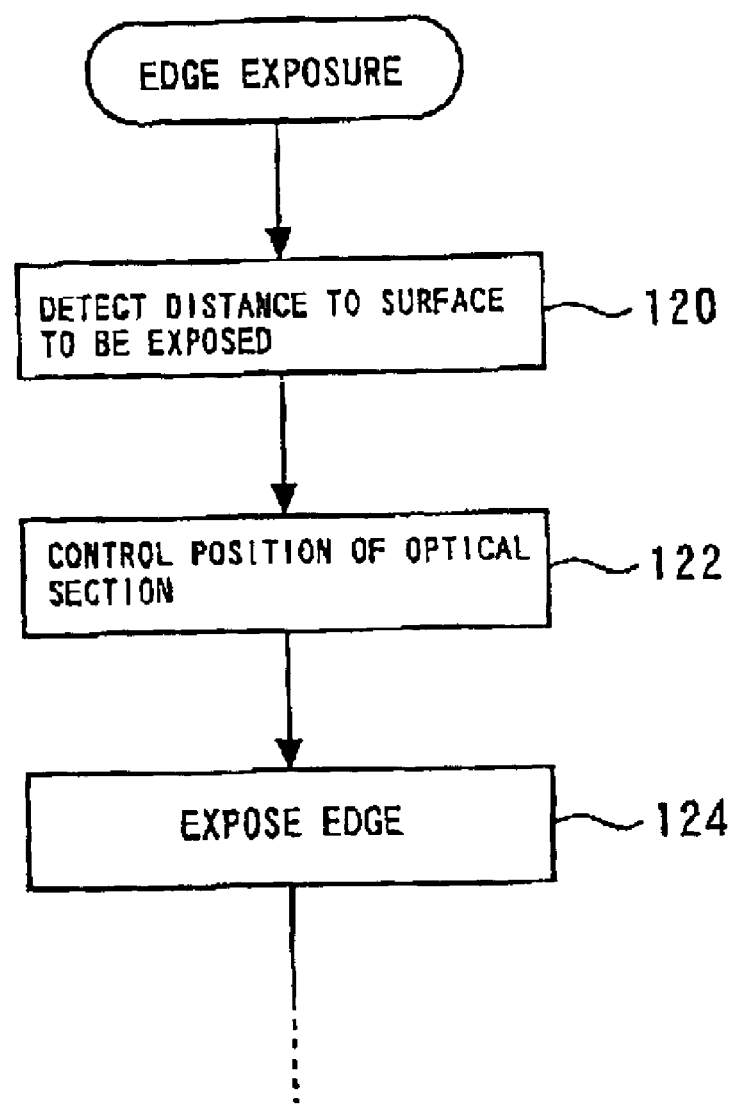
FIG. 2 is a flowchart showing a round of processing operations performed for implementing edge exposure processing by the wafer edge exposure apparatus according to the first embodiment.

FIG. 2 describes around of processing operations performed for implementing edge exposure processing by the wafer edge exposure apparatus according to the embodiment. The processing operations shown in FIG. 2 are sequentially performed by means of the control unit operating in accordance with a previously-stored program.

As shown in FIG. 2, in the wafer edge exposure apparatus according to the embodiment, a distance from the lower end of the optical section 36 to the surface of the semiconductor wafer 34 (surface to be exposed) is detected on the basis of a result of detection performed by the focus sensor 37 (step 120).

The position of optical section 36 is adjusted on the basis of the thus-detected distance (step 122). More specifically, the position control motor 40 is driven such that the thus-detected distance matches the focal distance of the optical section 36 stored beforehand. As a result, a relative position between the surface to be exposed and the optical section 36 is controlled at all times to maintain a predetermined optical relationship, regardless of variations in the height of a surface to be exposed.

Next, the optical section 36 produces exposure light 50, and the chuck drive motor 30 is rotated, whereby there is performed processing for exposing the edge of the semiconductor wafer 34 (step 124). As a result of exposure processing being performed, the resist on the semiconductor wafer 34 is exposed under optimum focusing conditions. Accordingly, when development processing (step 108 shown in FIG. 3) is performed, the resist on the semiconductor wafer 34 is patterned such that the end face of the resist becomes substantially perpendicular.

As mentioned above, the wafer edge exposure apparatus according to the present embodiment enables appropriate patterning of the resist on the semiconductor wafer 34 at all times regardless of variations in the height of a surface to be exposed. Accordingly, use of the wafer edge exposure apparatus according to the present embodiment enables effective prevention of generation of foreign obstacles during the course of manufacture of a semiconductor device.

In the present embodiment, the position of the optical section 36 is controlled on the basis of the distance between the optical section 36 as detected by the focus sensor 37 and a surface to be exposed. However, basic data pertaining to control of position of the optical section 36 are not limited to the distance to be detected by the focus sensor 37. The position of the optical section 36 may be controlled on the basis of the height of a surface to be exposed as detected by a sensor provided outside the optical section 36.

In the present embodiment, the optimum focusing conditions are realized by control or position of the optical, section 36. However, a method for realizing optimum focusing conditions is not limited to that mentioned above. For example, the optical section 36 may be made stationary, and optimum focusing conditions may be realized by vertical movement at the semiconductor wafer 34. A zooming mechanism may be provided to the optical section 36, whereby optimum focusing conditions are realized by changing the focal distance of the optical section 36 through use of the zooming mechanism.

As has been described, according to the present invention, the edge of a semiconductor wafer can be exposed under optimum focusing conditions at all times regardless of variations in the height of resist applied over the surface of the semiconductor wafer; that is, variations in the height of a surface to be exposed. The present invention enables stabilization of quality of a semiconductor device, thereby increasing a manufacturing yield thereof.

Further, the present invention is not limited to these embodiments, but variations and modifications may be made without departing from the scope of the present invention.

The entire disclosure of Japanese Patent Application No. 2001-006107 filed on Jan. 15, 2001 including specification, claims, drawings and summary are incorporated herein by reference in its entirety.

What is claimed is:

1. A wafer edge exposure apparatus for exposing an edge of a semiconductor wafer, having a resist thereon, comprising:
   an optical section for radiating exposure light toward the edge of a semiconductor wafer; the semiconductor wafer having a resist thereon;
   a sensor for detecting the height of the edge; and
   a focus position control mechanism for controlling the focal position of exposure light originating from the optical section, on the basis of a value detected by the sensor.

2. The wafer edge exposure apparatus according to claim 1, wherein
   the sensor includes a focal sensor for sensing a distance between the optical section and the edge; and
   the focus position control mechanism controls a focusing position of exposure light such that the focus of exposure light originating from the optical section matches the height of an edge surface.

3. The wafer edge exposure apparatus according to claim 1, wherein the focus position control mechanism includes a position control mechanism for controlling a relative position between the optical section and the edge.

4. The wafer edge exposure apparatus according to claim 1, wherein the focus position control mechanism includes a zooming mechanism for controlling the focal distance of the exposure light originating from the optical section.

5. The wafer edge exposure apparatus of claim 1, further comprising:
   a chuck for retaining the semiconductor wafer thereon; and
   a drive for rotating the chuck so that the radiating exposure light irradiates only an annular portion of the edge.

6. A wafer edge exposure method for exposing an edge of a semiconductor wafer, having a resist thereon, comprising:
   a detection step for detecting the height of an edge of the semiconductor wafer, the semiconductor wafer having a resist thereon;
   a control step for controlling the focusing position of exposure light radiated toward the edge, on the basis of a height of the edge; and
   an exposure step of radiating exposure light towards the edge after the control step.

7. The wafer edge exposure method according to claim 6, wherein
   the detection step includes a step of sensing a distance between an optical section for outputting exposure light and the edge; and
   the control step includes a focus control step for controlling a focusing position of the exposure light originating from the optical section such that the focus of the exposure matches the height of an edge surface.

8. The wafer edge exposure method according to claim 7, wherein the step of controlling a focus includes a step of controlling a relative position between the optical section and the edge.

9. The wafer edge exposure method according to claim 7, wherein the focus position control step includes a step of controlling the focal distance of the exposure light by means of driving a zooming mechanism of the optical section.

10. The wafer edge exposure method of claim 6, wherein only an annular portion of the edge is irradiated in the exposure step.

11. A wafer edge exposure apparatus for exposing an edge of a semiconductor wafer, comprising:
    an optical section for radiating exposure light toward the edge of the semiconductor wafer;
    a sensor for detecting the height of the edge; and
    a focus position control mechanism for controlling the focal position of exposure light originating from the optical section, on the basis of a height of the edge detected by the sensor.

12. A wafer edge exposure method for exposing an edge of a semiconductor wafer, comprising:
    a detection step for detecting the height of the edge of the semiconductor wafer;
    a control step for controlling the focusing position of exposure light radiated toward the edge, on the basis of a height of the edge; and
    an exposure step of radiating exposure light towards the edge after the control step.

* * * * *

UNITED STATES PATENT AND TRADEMARK OFFICE
CERTIFICATE OF CORRECTION

PATENT NO. : 6,875,971 B2  
DATED : April 5, 2005  
INVENTOR(S) : Kim

Figure 4A:
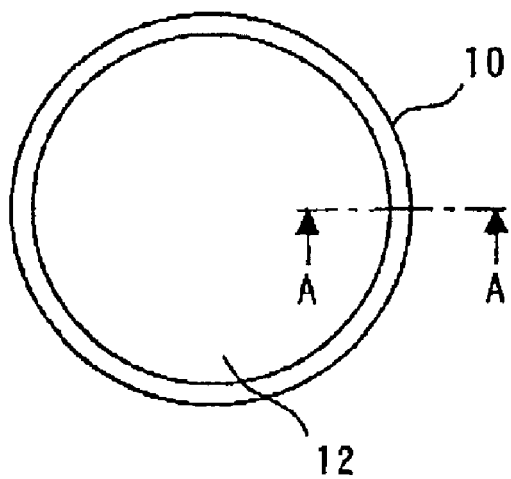
FIGS. 4A and 4B are drawings for explaining a state of a resist whose edge portion is removed by means of a thinner.
Figure 4B:
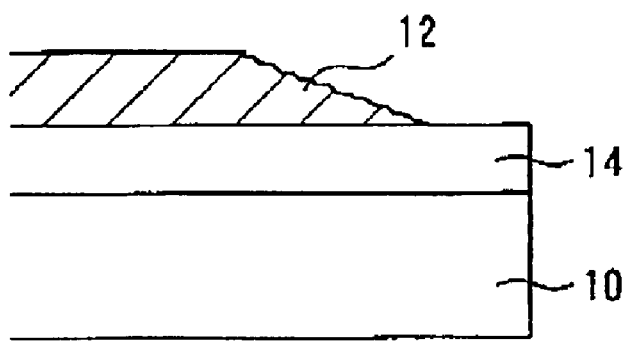
Figure 5:
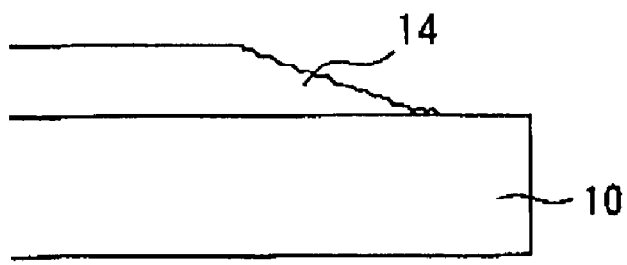
FIG. 5 shows a first layer film which has been etched while the resist shown in FIGS. 4A and 4B is taken as a mask.
Figure 6A:
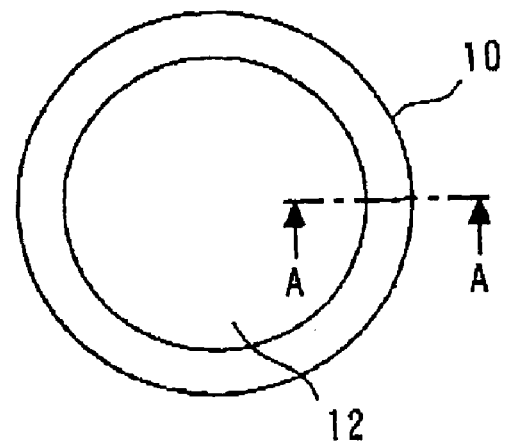
FIGS. 6A and 6B are drawings for explaining a state of a resist whose edge portion is removed through edge exposure processing and development processing.
Figure 6B:
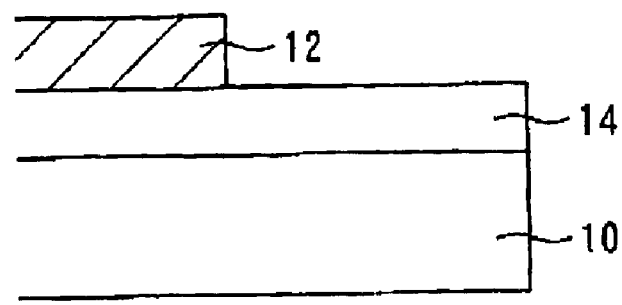
Figure 7:
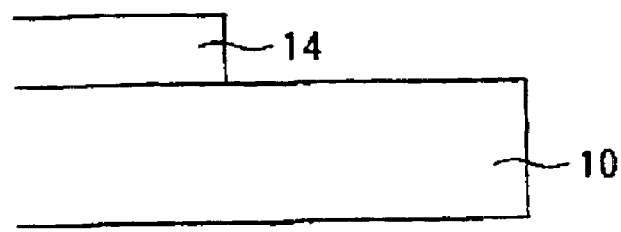
FIG. 7 shows a first layer film which has been etched while the resist shown in FIGS. 6A and 6B is taken as a mask; arid
Figure 8:
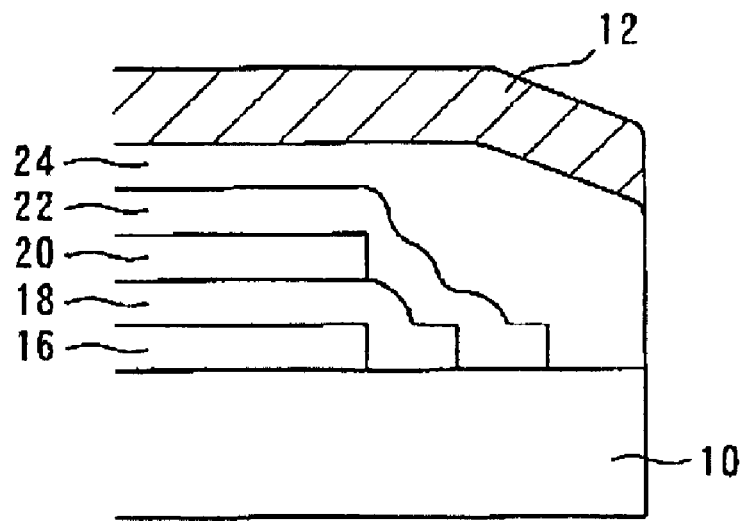
FIGS. 8 and 9 are drawings for explaining a problem which arises when related art wafer edge exposure method is employed.
Figure 9:
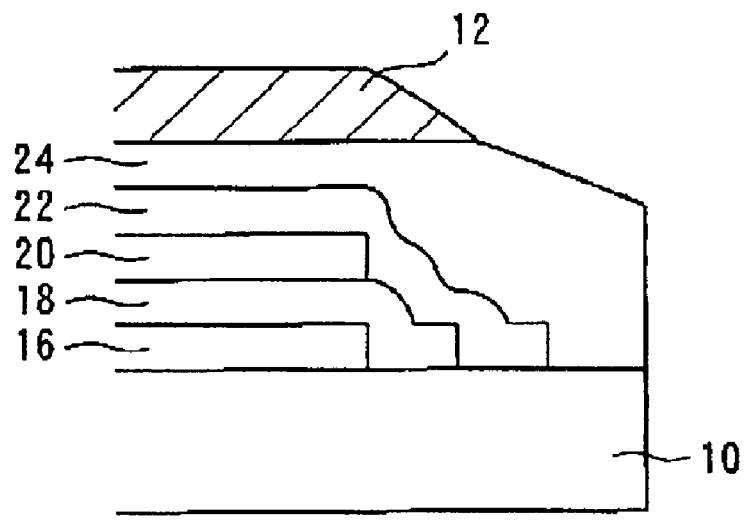

It is certified that error appears in the above-identified patent and that said Letters Patent is hereby corrected as shown below:

Column 1,  
Line 8, replace "a water edge" with -- a wafer edge --.  
Line 21, replace "semiconductor water" with -- semiconductor wafer --.  
Line 62, replace "FIG. 41" with -- FIG. 4B --.

Column 2,  
Line 48, replace "related art" with -- related-art --.

Column 3,  
Line 20, replace "section a of" with -- section of --.  
Line 41, replace "mask; arid" with -- mask; and --.

Column 5,  
Line 24, replace "control or position" with -- control of position --.  
Line 51, replace "wafer, having" with -- wafer having --.  
Line 54, replace "wafer; the" with -- wafer, the --.

Column 6,  
Line 18, replace "wafer, having" with -- wafer having --.

Signed and Sealed this

Thirtieth Day of May, 2006

JON W. DUDAS  
*Director of the United States Patent and Trademark Office*